Figure 1:
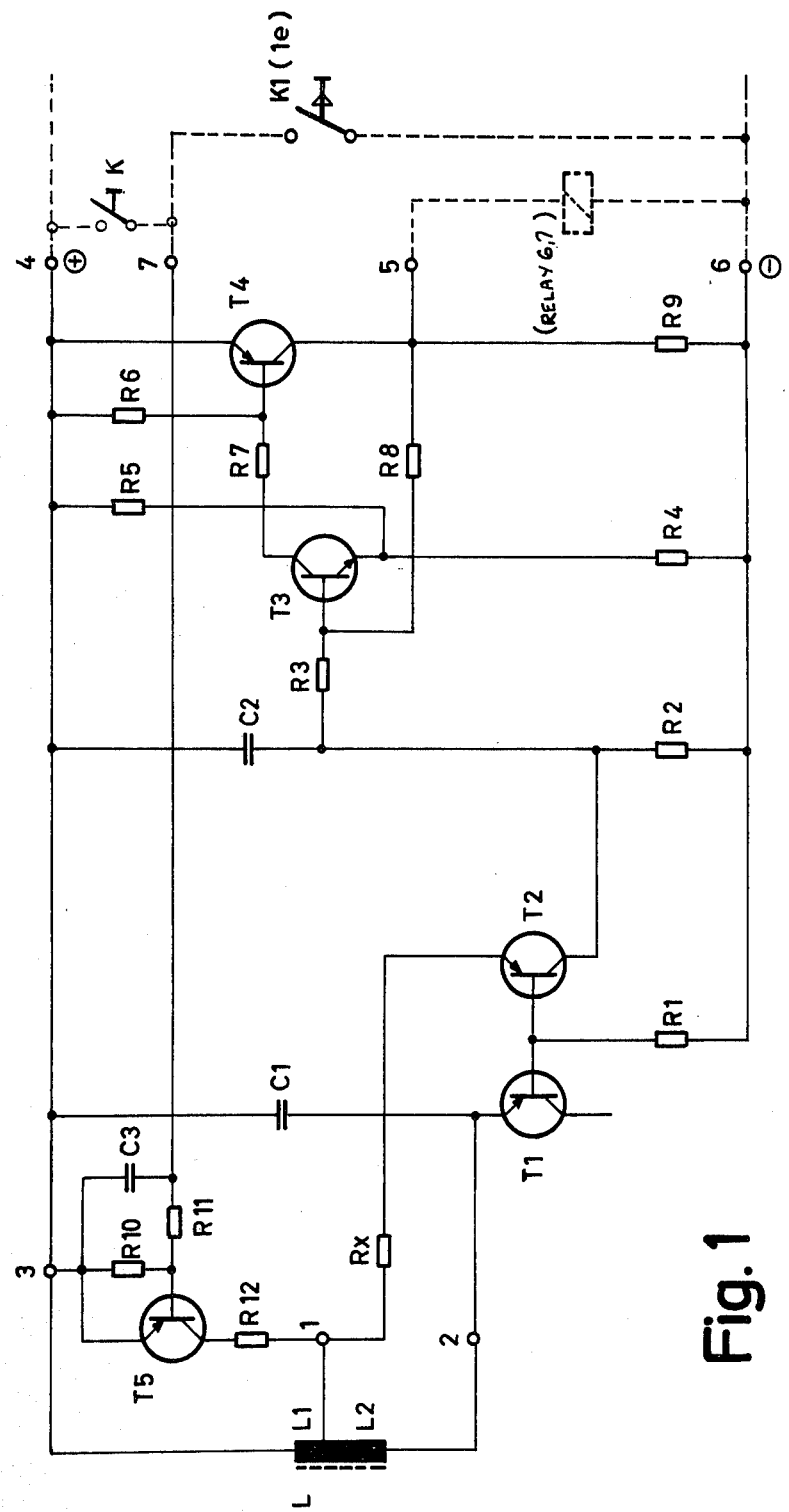

United States Patent [19]

Hermle et al.

[11] 4,433,309

[45] Feb. 21, 1984

[54] PROXIMITY SWITCH WITH BUILT-IN TEST CIRCUIT

[75] Inventors: Rolf Hermle, Nürtingen; Heinz Kammerer, Ostfildern-Nellingen; Hans Langheinrich, Leonberg, all of Fed. Rep. of Germany

[73] Assignee: Gebhard Balluff Fabrik Feinmechanischer, Fildern, Fed. Rep. of Germany

[21] Appl. No.: 238,200

[22] Filed: Feb. 25, 1981

[30] Foreign Application Priority Data

Mar. 1, 1980 [DE] Fed. Rep. of Germany ....... 3007929
Aug. 2, 1980 [DE] Fed. Rep. of Germany ....... 3029489

[51] Int. Cl.$^3$ .............................................. G08B 13/26
[52] U.S. Cl. ......................................... 331/65; 328/5; 340/562; 331/44
[58] Field of Search ...................... 331/65, 44, 117 R; 340/514, 562–564; 328/5

[56] References Cited

U.S. PATENT DOCUMENTS 3,747,012 7/1973 Buck ..................................... 331/65
3,829,850 8/1974 Guetersloh ..................... 340/563 X

FOREIGN PATENT DOCUMENTS 1287124 1/1969 Fed. Rep. of Germany .......... 328/5
2713982 10/1978 Fed. Rep. of Germany ........ 331/65

Primary Examiner—Siegfried H. Grimm
Assistant Examiner—Edward P. Westin
Attorney, Agent, or Firm—Shenier & O'Connor

[57] ABSTRACT

An inductive proximity switch with a built-in testing circuit for monitoring movable elements in which an oscillator has an inductive control element, the impedance of which varies in response to approaching elements with a built-in electrical tester for monitoring the correct functioning of the proximity switch wherein the tester has an electrically switchable damping circuit for damping the oscillator for test purposes.

15 Claims, 6 Drawing Figures

PROXIMITY SWITCH WITH BUILT-IN TEST CIRCUIT

The invention relates to a proximity switch for the monitoring of movable elements comprising an oscillator with an inductive or capacitive control element variable in its impedance due to approaching elements and an electric monitoring means for monitoring the correct functioning of the proximity switch.

A proximity switch of this type is known from German published patent application (DE-AS) 21 40 056 and covers electrical monitoring means, with which mechanical damage to the feeler head may be evaluated such that a testing signal, which is normally constant and provided on an outgoing circuit, will be interrupted.

The known proximity switch is particularly advantageous insofar as, when a monitoring element is damage or destroyed, a pre-alarm is initiated before the actual control element of the proximity switch is damaged. On the other hand a special design is required for the feeler head of the proximity switch already known and this may be undesirable for reasons of cost and in view of the fact that the number of different types of feeler heads is to be kept as small as possible.

A proximity switch with corresponding monitoring means for electric, in particular electronic component parts, is also known from German printed patent specification (DE-PS) 21 66 021, according to which a continuous signal is produced, which indicates that the operating conditions at different circuit points, which are to be compared with each other, correspond to the operating conditions given; a failure or interruption of this continuous signal then indicates a fault. This known proximity switch with monitoring means requires a corresponding complex circuit means which, in certain cases, also leads to undesirably high costs.

Proceeding on the basis of this prior art the object of the invention is to disclose an improved proximity switch, with which it is possible to have controlled monitoring in the form of a testing of proper functioning at the same time keeping the complex circuit means small; it is, in particular, to be examined whether the desired damping of the oscillator can be initiated by an approaching movable element and/or whether the activation conditions of the proximity switch correspond to the original activation distance.

This object is accomplished according to the invention by the monitoring means having an electrically switchable damping circuit for testing purposes, the oscillator being dampable with the aid of this damping circuit.

The decisive advantage of the design of the monitoring means according to the invention is that, firstly, the possibility exists of simulating a damping of the oscillator which corresponds to damping by a movable element, which is to be monitored. If this simulated damping, which is carried out for testing purposes, does not result in a corresponding output signal of the proximity switch it is immediately evident that a malfunction must exist, which for reasons of safety then requires an interruption of operations and corresponding repairs. In practice such testing may, for example, be carried out periodically or before each machine control signal which causes the elements, which are to be monitored, to move.

The construction of the monitoring means according to the invention also enables testing of the correct activation distance by simulating a damping, corresponding to the activation distance, of the externally undamped oscillator, which in this case must not continue to oscillate when the testing signal is generated, and by a predetermined de-damping of the oscillator externally damped, which in this case must oscillate again for the duration of the testing signal since operating conditions are created by the de-damping which correspond to an activation distance smaller than the proximity, which is admissible for reasons of safety, of the movable elements to be monitored.

According to the invention the proper functioning of the proximity switch can be tested in the case of oscillators damped from outside as well as in the case of oscillators not damped from outside. All the safety criteria, which have to be considered for the protection of machines, working parts and operating personnel, can therefore be checked.

A further object of the invention is to make optimum use of the monitoring possibilities offered by a single proximity switch according to the invention during a particularly critical phase of operation, i.e. when starting a machine, in particular when starting a machine with at least two proximity switches connected in parallel, these being associated to the end positions of a movable machine element, in particular a plunger movable along a rod; "connection in parallel" is to be understood as equivalence of the proximity switches to each other in respect of functioning and their connections to the rest of the circuit means.

This object is accomplished in the case of the proximity switch of the type described above according to the invention in that the monitoring means is connected to the switching means of a starting control circuit provided with the proximity switch such that each starting procedure necessarily initiates an electrical switching of the damping circuit to dampen the oscillator.

The decisive advantage of this construction of the invention is that the testing of at least one proximity switch in respect of its proper functioning is included in the testing of the starting functions of a starting control circuit. In other words a starting control circuit is created, with which, in conjunction with the starting procedure, the proper functioning of at least one proximity switch is tested, in particular the proper functioning of two proximity switches connected in parallel; at the same time the switching functions of the starting means themselves will also be tested, for example testing of various relays as to the proper opening and closing of their switch contacts.

Figure 2:
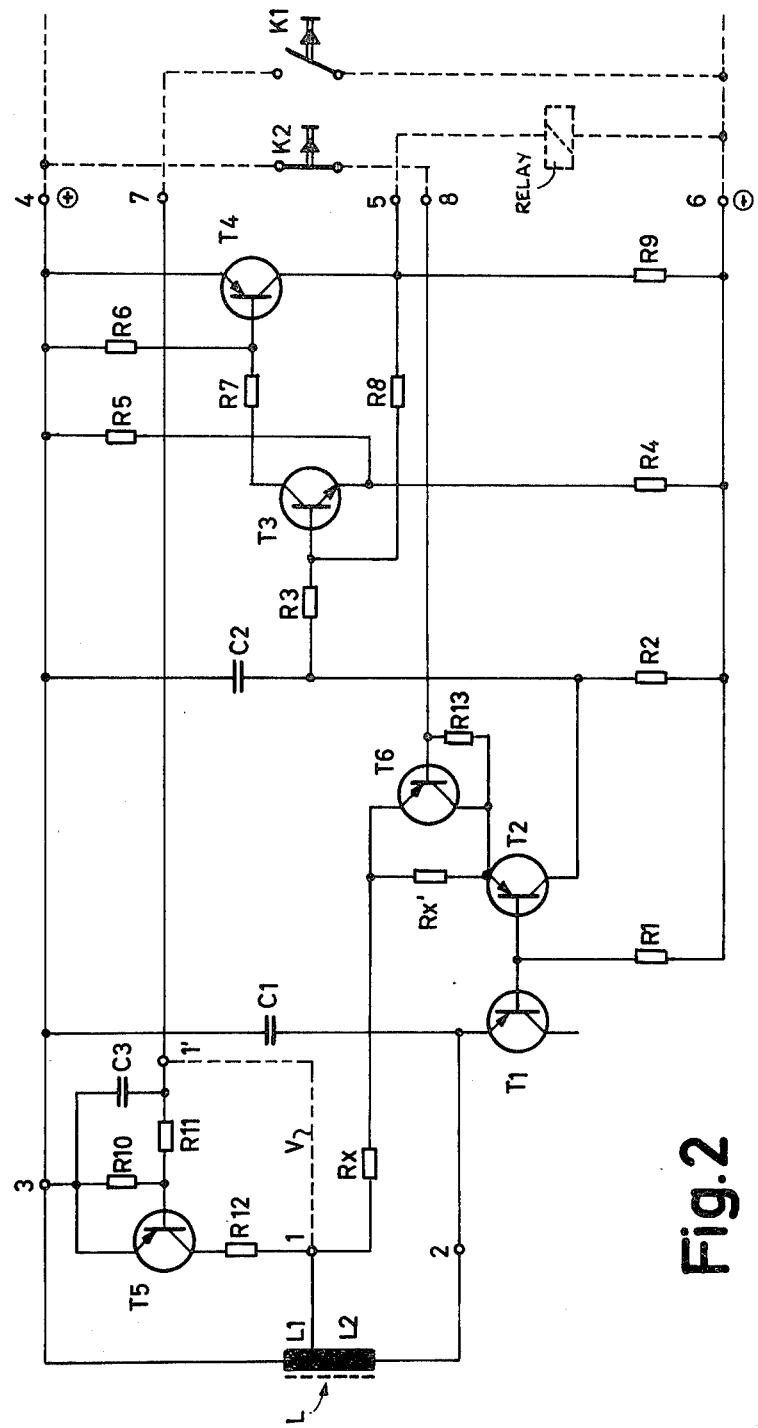
Figure 3:
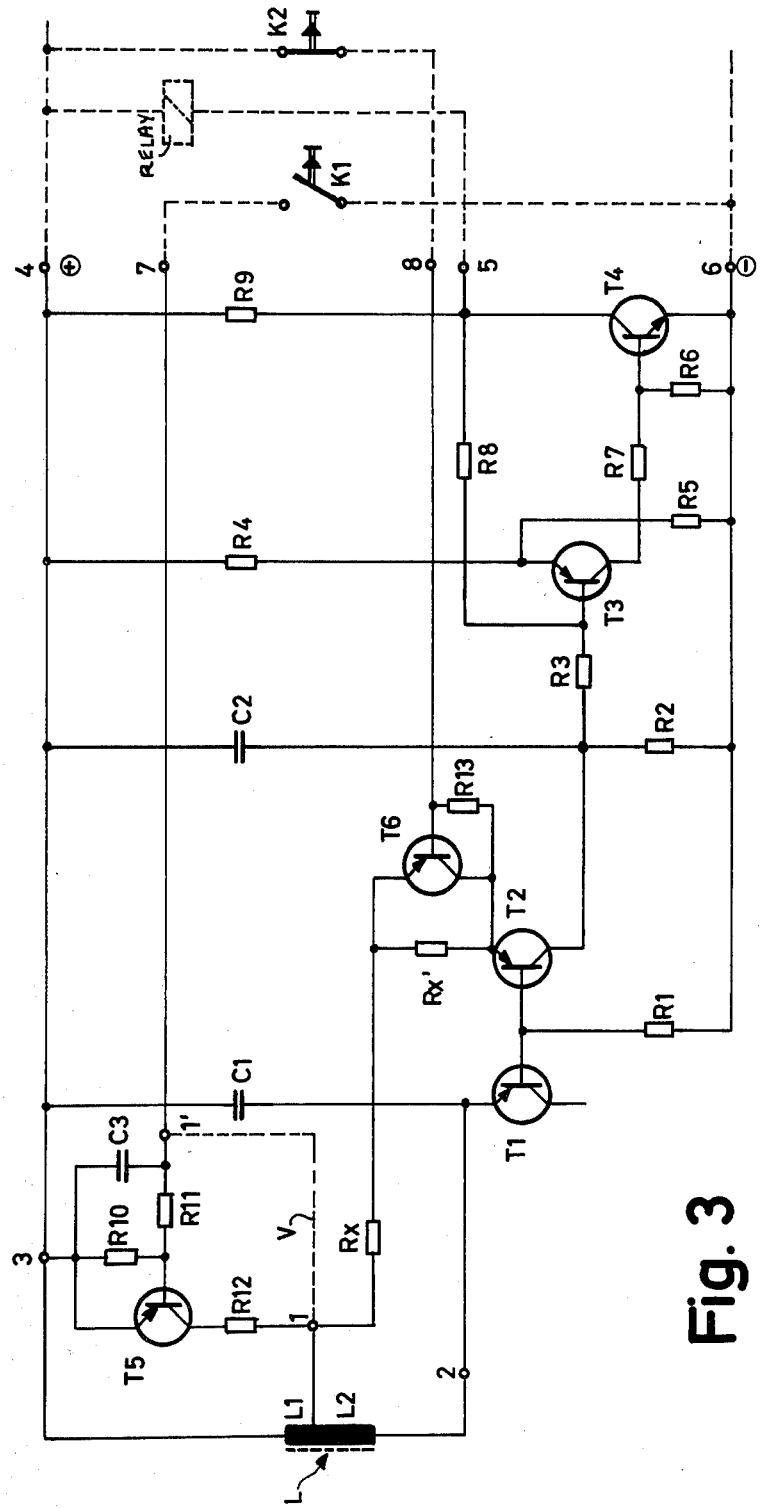
Figure 4A:
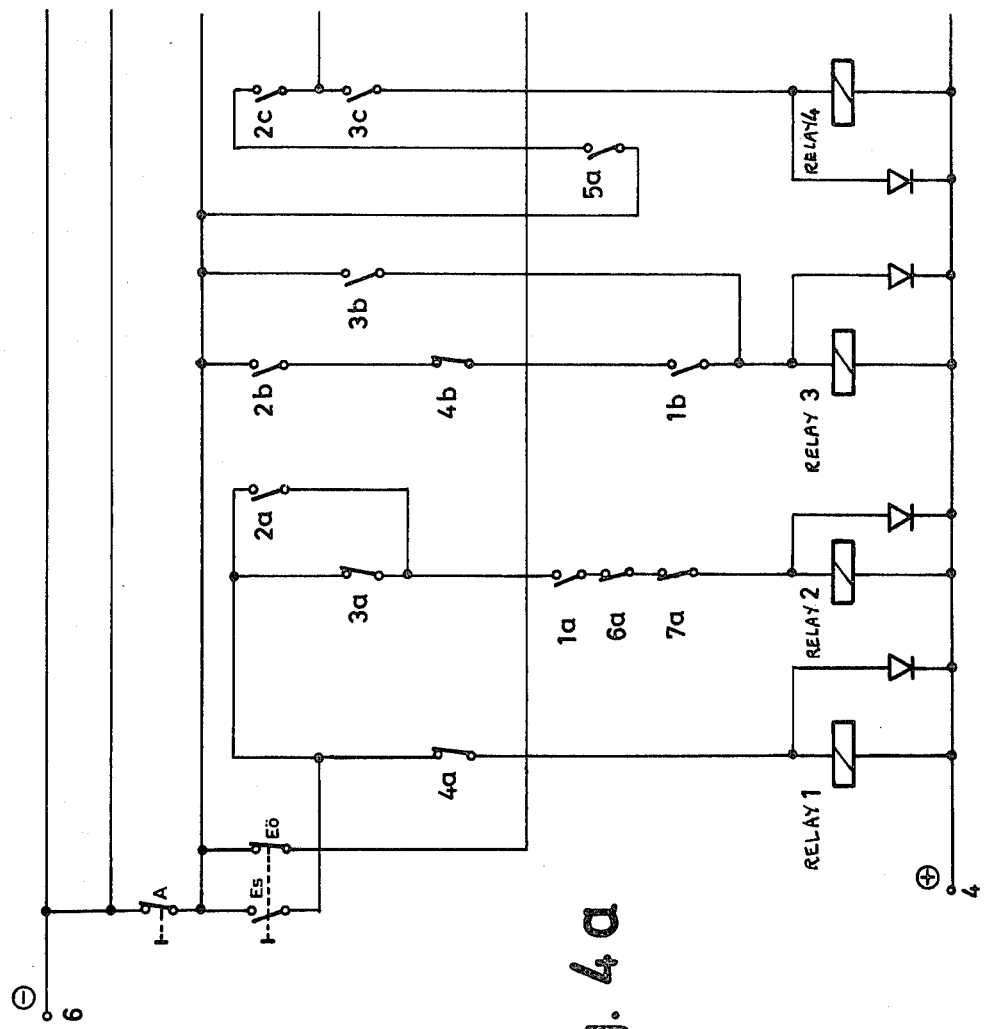
Figure 4B:
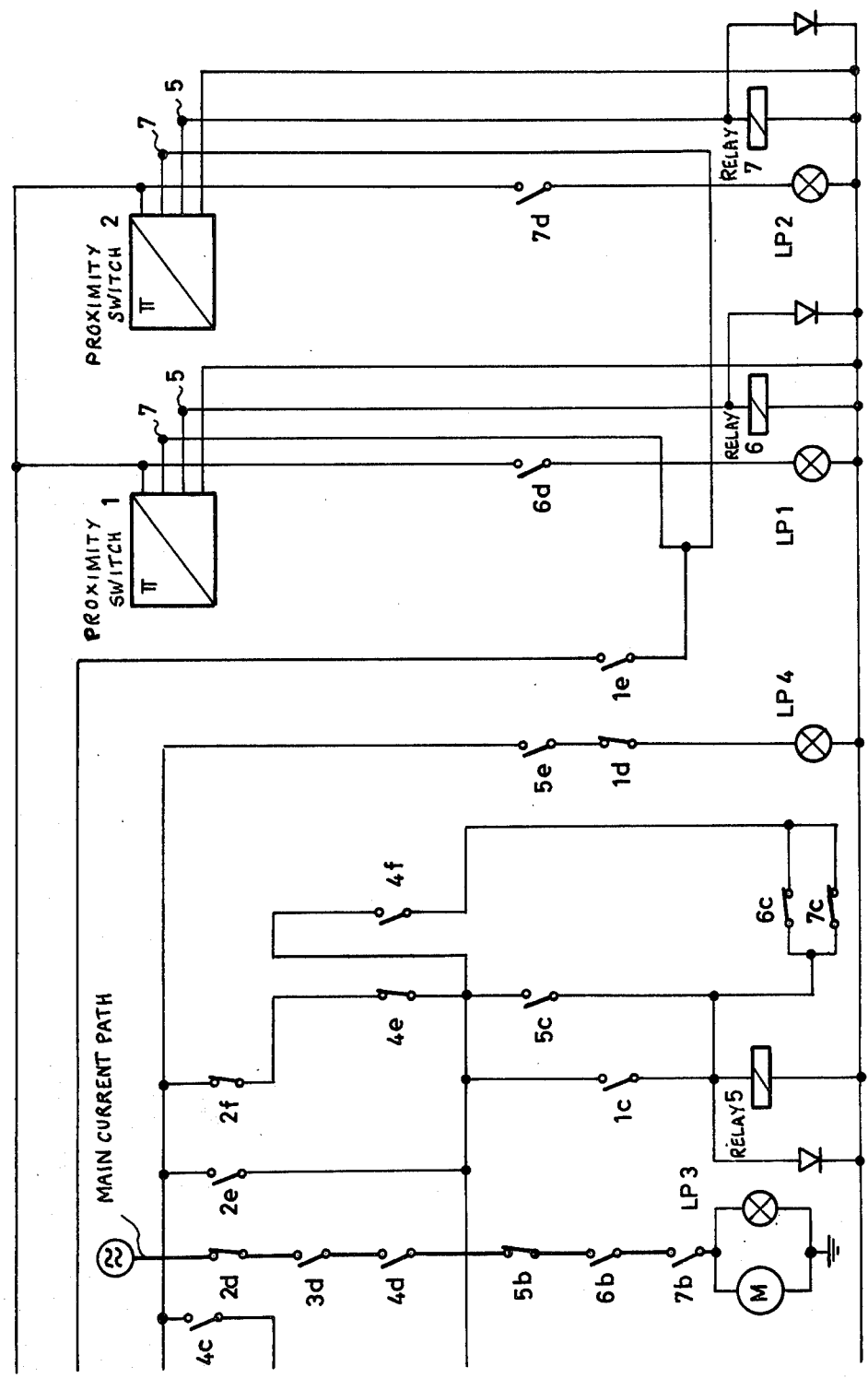

Additional details and advantages of the invention are described more fully in the following with the aid of drawings. The drawings show:

FIG. 1—a circuit diagram of a first, preferred embodiment of a proximity switch according to the invention operating as a normally closed switch;

FIG. 2—a circuit diagram of a second, preferred embodiment of a proximity switch according to the invention operating as a normally closed switch;

FIG. 3—a circuit diagram of a preferred embodiment of a proximity switch according to the invention operating as a normally open switch and FIG. 4a to FIG. 4c—a circuit diagram of a starting control circuit according to the invention with two proximity switches according to FIG. 1.

The circuit diagram according to FIG. 1 shows, if the circuit elements between the circuit points 1, 3 and 7 are disregarded, a standard proximity switch operating as a normally closed switch with a pnp output transistor. This proximity switch has at its input a feeler coil (L) which is normally disposed in a cup core open towards the front—i.e. in the direction of the movable elements. The outer connections 2, 3 of the feeler coil are connected to connections 4 and 6 of the proximity switch, to which a positive (+) or (via R1, T1) a negative (−) voltage are applied. A capacitor C1 lies parallel to the feeler coil L, capacitor C1 and feeler coil L together forming an oscillatory circuit L, C1.

The oscillator of the proximity switch according to FIG. 1 also has two transistors T1 and T2 and three resistors Rx, R1 and R2. The base connections of transistors T1 and T2 are connected via resistor R1 with connection 6 of the proximity switch. The emitter of transistor T1 is connected on the one hand with the outer connection 2 of feeler coil L and on the other hand with capacitor C1. The collector of transistor T1 is left unconnected so that merely the base-emitter circuit of transistor T1 is operative as a diode; the electrical properties of this diode can, however, be matched very exactly to the properties of transistor T2, the collector of which is connected via resistor R2 to connection 6 and the emitter of which is connected via resistor Rx to connection 1 of the proximity switch 1, i.e. to a tab of feeler coil L which is subdivided by this tab into two coil portions L1 and L2.

A trigger circuit is connected to the oscillator described above, this trigger circuit having a capacitor C2, resistors R3–R9 and two further transistors T3 and T4; the capacitor C2 is also to be regarded as an integral part of the oscillator.

Of the above-mentioned component elements the capacitor C2 is connected on the one hand to connection 4 of the proximity switch and on the other hand to the collector of transistor T2. The common connection point for transistor T2, resistor R2 and capacitor C2 are connected via a resistor R3 to the base of transistor T3 of the trigger circuit. The emitter of transistor T3, which is designed as an npn transistor, is connected on the one hand via resistor R4 with connection 6 and on the other hand via resistor R5 with connection 4 of the proximity switch. The collector of transistor T3 is connected via resistor R7 with the base of transistor T4. The base of transistor T4 is also connected via resistor R6 to connection 4 whereas the emitter of transistor T4 is directly connected to terminal 4. The collector of transistor T4 is connected via resistor R8 to the base of transistor T3 and via resistor R9 to connection 6 and forms a connection 5, which represents the actual ouput of the trigger circuit and, therefore, of the entire proximity switch. Evaluation and switching means may be connected between connections 5 and 6 in the known way; these are indicated in FIG. 1 by a relay Rel. shown in dotted lines.

In the case of a proximity switch of the type described above the feeler coil L is normally disposed in a pot core open at the front so that a magnetic field, which is widely spread, is created. If a metal element is moved into this field induced eddy currents circulate within it, these extracting energy from the field. These eddy-current losses cause a deterioration in the Q factor of the oscillating circuit so that the amplitude of oscillation is reduced; the oscillating circuit is, in other words, damped.

If the oscillating circuit or rather the oscillator oscillates the elements R2, T2, Rx and L1 form a voltage divider for the duration of the negative half wave of the oscillation. This causes a relatively high negative voltage at the collector of transistor T2 as the resistor R2 is highly resistive in comparison with the remaining elements of the voltage divider. This results in the capacitor C2 being charged at the input to the trigger circuit. If transistor T2 is rendered non-conductive during the positive half wave of the oscillation capacitor C2 will discharge slightly via resistor R2 until the next negative half wave of the oscillation occurs. Capacitor C2 therefore stabilizes the voltage at the collector of transistor T2 or at the input to the trigger circuit such that a direct voltage with negligible residual ripple results. This voltage is so high that transistors T3 and T4 are switched into the conductive state so that the relay between connections 5 and 6 is activated.

If the oscillating circuit is now, as described above, damped by a metal element the amplitude of oscillation of the oscillator will be smaller, the capacitor C2 will be more highly charged while the voltage at the collector of transistor T2 will become less and less in comparison with the voltage at connection 4 until it is, finally, no longer sufficient to switch the transistor T3 into the conductive state. Transistor T4 will also be rendered non-conductive along with transistor T3 and the relay Rel. will drop out. In the case of the proximity switch under consideration the resistor Rx serves to set the activation distance, i.e. the distance from the front of the feeler head, to which the metal element must be brought in order to dampen the oscillation of the oscillator enough to trigger the trigger circuit.

If such a proximity switch is used on a machine to monitor the operating conditions a malfunction of the proximity switch can have disastrous consequences. It is not critical if, due to a functional error, a damping is simulated by mistake and the relay Rel. drops out. In this case an operating condition is (wrongfully) indicated, this preventing the machine being switched on. If, however, a damping of the oscillator actually takes place, for example because a machine member has almost reached its final position, the output signal of the proximity switch still, however, simulates a free oscillation of the oscillator, which could be the case, for example, if one of the transistors T2, T3 or T4 has been deleted, the machine can still start; this could lead to severe damage to the machine or even injury to personnel. For this reason it ought to be possible to test the proximity switch to see that it is functioning properly.

In the case of a proximity switch according to FIG. 1 this testing possibility can be provided according to the invention by the tab of the feeler coil L, i.e. connection 1, being directly and conductively connected via the circuit V, marked as a broken line, to connection 1', which is directly connected to connection 7 of the proximity switch. If a key device K, e.g. a push button, is provided at the end of a length of connecting wire, this being connected to connections 4 and 7 of the proximity switch, the coil portion L1 of the feeler coil L can be short circuited by closing the key device. The oscillation of the oscillating circuit or the oscillator will be damped or suppressed so that the relay Rel. must drop out when the proximity switch is functioning properly and be activated again when the key contact is opened. The testing switch, which in order to simplify matters is represented in FIG. 1 as key device K, can be any suitable switch, in particular an electronic switch, which may be closed periodically according to the special features of the equipment concerned in order to test the functioning of the proximity switch or before the initiation of corresponding machine functions.

In the case of the particularly simple variant or example of the invention explained above, for which scarcely any additional effort of any importance is required, difficulties could arise in certain circumstances if a longer length of cable is provided between the testing switch and the connections 4 and 7 of the proximity switch. The distributed inductances and capacitances of the cable could prevent an effective short-circuiting of the coil portion L1. In addition, the cable acts as an antenna, via which all possible faults in the proximity switch may go into effect when the testing switch is opened. Added to this is the fact that the connecting lines to connections 5 and 7, which are normally just as long, form a circuit with distributed inductances and capacitances so that switching pulses are conducted from the output of the trigger circuit to a feedback at the input to the proximity switch so that this is able to switch on and off rapidly in a transition area. The switching variant described above should, therefore, be used only with relatively short connection leads of up to about 2 m in length. Even here it could be necessary in certain circumstances to insert a small series resistor in the short circuit.

If testing for proper functioning is to be at least largely independent of the length of the connection cable it is advantageous to provide a transistor switch comprising a transistor T5, resistors R10 and R11 and a capacitor C3 instead of the short-circuit connection between connections 1, 1' and 3. With this switching variant the collector-emitter circuit of transistor T5 is disposed between connections 1 and 3. The base of transistor T5 is also connected to connection 3 via resistor R10 and with connection 1' via resistor R11. Resistor R10 then provides for the low-resistance connection between emitter and base which is especially important at high temperatures whereas resistor R11 serves to limit base current. Finally, capacitor C3 between connections 1' and 3 serves as a filter member to block interference voltage peaks which could come in via the connecting cable. The feedback of noise pulses due to output pulses of the trigger circuit to the input of the proximity switch will also be suppressed with the aid of capacitor C3.

With the switching variant described above the transistor T5 will be switched into the conductive state when test key K1 is closed so that the coil portion L1 may be short circuited via the emitter-collector circuit of this transistor. The inventive concept also provides the possibility of inserting a resistor R12 in the collector branch of transistor T5, the resistivity of which being chosen such that the damping of the oscillatory circuit or the oscillator is approximately the same as damping by a metal element at the activation distance set by resistor Rx. If the relay Rel. drops out when test key K1 is closed and is activated again when the test key is opened it is not only ensured that the oscillator of the proximity switch is capable of being damped but also that the activation distance has not become too small, which could lead to the oscillator of the proximity switch continuing to oscillate even though the metal element to be monitored has come close enough.

In the case of the circuit according to FIG. 2 of the drawings the resistor for setting the activation distance is subdivided into two resistors Rx and Rx' connected in series; the collector-emitter circuit of transistor T6 is connected in parallel to the resistor Rx'. The base of transistor T6 is connected via resistor R13 to its collector and to the connection point of resistor Rx' and the emitter of transistor T2. The base of transistor T6 is also connected to connection 8 of the proximity switch which is connected via a test key K2 with a normally closed contact to connection 4 of the proximity switch. Connections 4 and 8 of the proximity switch may again be connected with the connections of test key K2 via a cable of corresponding length.

If, in the circuit according to FIG. 2, the oscillator of the proximity switch is damped by a metal element, which is to be monitored and is correspondingly close to the feeler head, transistor T6 may be switched into the conductive state by actuation of test key K2, the resistor thereby being tested. The resistivity of resistors Rx, Rx', which determine the activation distance, will hereby be reduced such that the oscillator would have to oscillate again if the proximity switch is functioning properly. If this is not the case this means that the activation distance has decreased in comparison with the activation distance originally set or that the metal element has been brought closer to the feeler head than was provided when the system was set. In both cases a testing of the system is necessary, this being indicated by the fact that the oscillator does not oscillate again even though the resistor Rx' has been short-circuited. Otherwise the circuit according to FIG. 2 works in the same way as explained above for the circuit according to FIG. 1.

The above explanation of how the circuit according to FIG. 2 functions shows clearly that testing as to whether the oscillator of the proximity switch can actually be damped may also be carried out with the circuit components Rx', T6, R13 and K2 if transistor T6 is normally held in a conductive state and then rendered non-conductive for testing purposes; a damping of the oscillations of the oscillator must then occur due to the additional effectiveness of resistor Rx' if the same is properly chosen and if the proximity switch is functioning properly. It is also clear that, in modification of the functioning of the circuit according to FIG. 1, the resistor R12 could be dimensioned such that the oscillator would oscillate at conductive transistor T5 and also be damped at the approach of a metal element to the feeler head. If the damping achieved at conductive transistor T5 due to the short-circuit branch with resistor R12 is counteracted by transistor T5 being rendered non-conductive the oscillator could then oscillate again in the embodiment shown according to FIG. 2 although its oscillating circuit is damped from outside by a metal element. The proper functioning of the proximity switch could therefore be tested in this way as well.

FIG. 3 of the diagrams shows a proximity switch according to the invention operating as a normally open switch and having a trigger circuit, the output transistor T4 of which is an npn transistor. The circuit according to FIG. 3 works completely analogously to the circuit according to FIG. 2 with the one difference that the conductivity type of transistors T3 and T4 is interchanged and that, as a result, the relay Rel. is activated at the connections 4 and 5 of the proximity switch when the oscillator is adequately damped and drops out when the oscillator oscillates freely.

In the case of the proximity switches according to FIGS. 1 and 2 any faults, which may occur in the circuit and feeler head, can be detected perfectly. The following particular faults, which could simulate oscillation even if the proximity switch is damped, are reliably detected:

1. Capacitor C2 is punctured (short circuit);
2. collector-emitter circuit of transistor T2 is short-circuited;
3. the resistivity of resistor Rx or resistors Rx, Rx' has sunk below the nominal value (if, for example, one of the resistors is burnt);
4. the collector-emitter circuit of the output transistor T4 is short-circuited;
5. the collector-emitter circuit of the input transistor T3 is short-circuited.

As a comparison of the switch variant operating as a normally closed switch with the switch variant operating as a normally open switch shows it is particularly advantageous that it is the faults which may lead to a serious interruption of operations or to an accident which are detectable. While the variants operating as normally closed switches allow short circuits to be detected in the switch itself in the case of the variant operating as a normally open switch it is possible to detect cold joints or fissures, which incorrectly result in oscillations, in a carrier supporting the structural elements and interconnecting lines, in particular a thick-film substrate.

Figure 4:
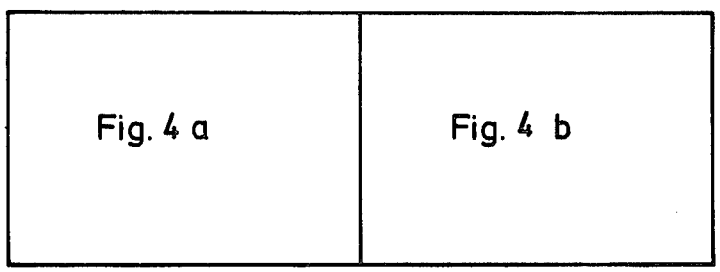

FIG. 4 shows a starting control circuit for a machine which is provided with two proximity switches according to FIG. 1 and is to be started only when the three following conditions are all fulfilled at the same time:

1. Neither of the proximity switches is damped; for example, a plunger movable along a rod, the movement or position of which is to be monitored, is disposed between the two switches.
2. Both proximity switches are working perfectly in respect of their internal functioning.
3. None of the five relays required for the starting control circuit, which are shown in the embodiment as relays with forcibly actuated contacts or as magnetic contactors, has a lead or coil break or switch contacts, which are fused together in the on or off position.

The testing or monitoring of the three above-mentioned conditions occurs according to the invention—according to a first variant—when a starting key "On" is depressed.

The starting control circuit has according to FIG. 4 the two proximity switches "proximity switch 1" and "proximity switch 2" as well as the usual supply voltage connections, i.e. connection 4 (+) and connection 6 (−). In addition, the above-mentioned starting key "On" and circuit-breaking key "Off" are provided together with the five above-mentioned relays Rel. 1 to Rel. 5 and two further relays Rel. 6 and Rel. 7 associated one to each of the two proximity switches and corresponding to relay Rel. in FIG. 1 where, for this reason, the reference to "(Rel. 6, 7)" is already inserted by relay Rel. In addition, the starting control circuit according to FIG. 4 has a diode for short-circuiting induced voltages connected in parallel to each of the relays Rel. 1 to Rel. 5. Four control lamps LP1 to LP4 are also provided, which serve in a prototype as a simple explanation of how the starting control circuit functions but can be provided in practice on an operator's console or the like.

The following procedures take place during the normal starting procedure of the starting control circuit according to FIG. 4, in which each of the individual relays Rel. 1 to Rel. 7 normally has several normally open contacts and normally closed contacts, which are each indicated by a corresponding numeral to show the pertinent relay and also with a small letter to distinguish them from each other—contact 4d is, for example, a fourth contact of relay Rel. 4:

When the starting key "On" is pressed a current flows from connection 6 via the normally closed contact A of the circuit-breaking key "Off" via the normally open contact Es of the starting key "On", a normally closed contact 4a of relay Rel. 4 and the relay Rel. 1 to connection 4. The relay Rel. 1 is thus activated so that its normally open contacts 1a, 1b, 1c, 1e close while its normally closed contact 1d opens. The closing of contact 1c causes relay Rel. 5 to be activated with the normally open contacts 5a, 5b, 5c and 5e. The normally open contact 1e corresponds, as indicated in FIG. 1, to the contact of testing switch K1 so that a simulated damping of the two proximity switches takes place, the connections 7 of which are connected in paralled to each other with contact 1e. The relays Rel. 6 and Rel. 7 associated to the proximity switches drop out due to the damping of the proximity switches. An electric circuit for the second relay Rel. 2 is completed via the contacts A, Es, a normally closed contact 3a of the third relay Rel. 3, the normally open contact 1a and the normally closed contacts 6a and 7a of relays Rel. 6 and Rel. 7 between connections 4 and 6 so that the second relay Rel. 2 is activated. The normally open contacts of the second relay Rel. 2, i.e. contacts 2a, 2b, 2c and 2e, close as a result while two normally closed contacts 2d and 2f of the second relay Rel. 2 open. Relay Rel. 2 is then self-holding via its normally open contact 2a. An electric circuit for relay Rel. 3 will be completed, due to the closing of contact 2b, between connections 4 and 6 via the contacts A and Es, the normally open contact 2b, normally open contact 1b and a normally closed contact 4b of the fourth relay Rel. 4. The normally closed contacts 3a and 3e of relay Re. 3 will open while its normally open contacts 3b, 3c, 3d close; the third relay Rel. 3 will subsequently be self-holding via its normally open contact 3b. An electric circuit is now also completed between connections 4 and 6 for the fourth relay Rel. 4 via the normally open contacts 2c, 3c, 5a so that this relay is activated and is self-holding via its normally open contact 4c. In addition, two further normally open contacts 4d, 4f close while three normally closed contacts 4a, 4b and 4e of the fourth relay Rel. 4 open. The electric circuit for the first relay Rel. 1 will be interrupted by the opening of normally closed contact 4a; relay Rel. 1 will then drop out. Due to the opening of normally open contact 1e the simulated damping of the two proximity switches will then end so that the 6th and 7th relays Rel. 6 and Rel. 7 are reactivated. The electric circuit for the second relay Rel. 2 will also be interrupted by the opening of normally open contact 1a so that the second relay also drops out. Normally open contact 1c also opens when relay Rel. 1 drops out. The electric circuit for the fifth relay Rel. 5 will, however, remain closed for a moment via the connection comprising the contacts 5c and 5e until contact 2e also opens. At this time the fifth relay must drop out as both normally closed contact 3e and normally closed contact 4e are opened. As soon as the second and fifth relays Rel. 2 and Rel. 5 have dropped out and relays Rel. 6 and Rel. 7 have been reactivated the current path for machine M, accentuated in FIG. 4 by thick lines, is closed so that a current can flow via the machine and the emitter-collector circuit with the contacts 2d, 3d, 4d, 6b, 7b and 5b; a green control lamp LP3 connected in parallel to the machine will then light up. From the above it is apparent that the machine can be started when the relays and the proximity switch are in proper order and when the starting key "On" is depressed at least until relays Rel. 1 and Rel. 2 have responded. Subsequently, the starting key "On" can be released again; the starting procedure will automatically continue until machine M is switched on.

So that the person operating the machine can clearly see that the starting procedure is progressing properly with testing of the two proximity switches the control lamps LP1, LP2 are associated to the two proximity switches. These lamps light up—their electric circuit is completed via the normally open contacts 6d or 7d—when the proximity switches are undamped and if the relays Rel. 6 and Rel. 7 have been activated and they must accordingly go out immediately when damping of the proximity switches is simulated by closing of normally open contact 1e. A fourth control lamp designed as a red lamp serves finally to indicate faults.

While serveral fundamental conditions of the starting control circuit according to FIG. 4 have been explained above additional contacts and current paths are, as the drawing shows, provided. These enable special monitoring of particular fault conditions as a person skilled in the art will discern from the circuit diagram.

Just how extensive monitoring of the starting control circuit according to the invention is is clearly shown in the following lists; list 1 gives the fault possibilities of the structural elements while list 2 gives information on various cases of failure in the relay contacts in the starting control circuit.

Altogether the list shows clearly that practically any fault which could impair the operation of the machine is detected; generally this will be indicated by the red control lamp LP4 except in the cases where there is no voltage or where no voltage is connected through. In these cases, however, there is no danger that the machine will start or continue to run and as a result no faults can occur which could endanger machine or tools. In this connection the normally open contacts 6b and 7b in the main contact circuit are to be particularly noted; these provide for an immediate interruption in supply to the machine M if one of the proximity switches is damped and the pertinent relay drops out. The interruption also causes, via contacts 6c and/or 7c, an activation of relay Rel. 5 so that the red lamp LP4 lights up.

(In the following lists the relays and their contacts are only mentioned by their respective numbers)

LIST 1

| Case | Component | Fault | Description of Function | Main Contact Circuit interrupted by | Red Lamp |
|---|---|---|---|---|---|
| 1 | Rel. 1 | not dropping out | 6 and 7 remain dropped out, 5 got voltage via 1c and 2e, after release of E 2 drops out, 5 gets voltage via 1c (5c also in parallel) and Eo | 5b, 6b, 7b opened | no as 1d opened |
| 2 | | Dropping out delayed | 5 no longer drops out as 1c is bridged by 5c and 5 gets voltage via 5c and Eo | 5b opened | yes as 5e closed and 1d also (with delay) closes |
| 3 | | not attracted | Starting procedure does not begin | 3d and 4d opened | no as 5e open |
| 4 | Rel. 2 | not dropping out | 5 gets voltage via 1c and 2e and is self-holding via 5c and 2e | 2d and 5b opened | yes via 5e and 1d |
| 5 | | delayed dropping out (after release of E) | 5 gets voltage via 1c and 2e and is self-holding via 5c and 2e, after release of E also parallel via Eo. If 2e opens, 5 is self-holding via 5c and Eo. | 5b opened | yes via 5e and 1d |
| 6 | | not attracted | Starting procedure stopped after attraction of 1. 5 gets voltage via 2f, 1c (and immediately afterwards in parallel via 5c). After release of E 1c opens but 5 is self-holding via 5c and Eo (also in parallel 4 and 2f) | 3d, 4d, 5b opened | yes via 5e and 1d |
| 7 | Rel. 3 | not dropping out | Starting procedure stopped after attraction of 1 as 2 cannot attract due to open 3a, 4 due to open 2c. 5 gets voltage via 1c, 4e, 2f, after release of E self-holding via 5c, 4e, 2f (in parallel also via Eo) | 4d, 5b opened | yes via 5e and 1d |
| 8 | | not attracted | Starting procedure stopped after attraction of 2, 4 cannot attract due to open 3c, 5 gets voltage via 1c and 2e, after release of E 5 usually not self-holding if 2e opens and Eo does not immediately close | 3d, 4d opened | usually no if 5 not self-holding, i.e. 5e open |
| 9 | Rel. 4 | not dropping out | No starting procedure possible as 4a open and 1 cannot get voltage. 5 receives no voltage | 3d opened | no as 5e open |
| 10 | | not attracted | Starting procedure stopped after attraction of 3. 5 gets voltage via 1c and 2e, is usually not self-holding, however, after release of E if 2e open and Eo does not immediately close | 4d opened | usually no if 5 not self-holding, i.e. 5e open |
| 11 | Rel. 5 | not dropping out | Starting procedure normal | 5b opened | yes via 5e and 1d |
| 12 | | not attracted | Starting procedure stopped after attraction of 3 as 4 gets no voltage due to 5a opened | 4d opened | no as 5 not attracted, as a result 5e open |
| 13 | Rel. 6 Rel. 7 | not dropping out | Starting procedure interrupted after attraction of 1 as 2 cannot attract due to open 6a (7a). 5 receives voltage via 1c, 4, 2f, after release of E via 5c, 4, 2f (also in parallel via Eo) | 3d, 4d, 5b opened | yes via 5e and 1d |
| 14 | | not attracted | Starting procedure normal, 5 drops out again. After release of E 5 gets voltage again via Eo,4f,6c (7c) | 6b (7b) opened | yes via 5e and 1d |
| 15 | Proximity switch 1 or 2 | dampened after successful start or has fault | 5 gets voltage via Eo, 4f, 6c (7c). Afterwards self-holding via 5c and Eo. 5 remains attracted even if proximity switch de-damped again | 5b opened, during damping also by 6b (7b) opened | yes via 5e and 1d |

LIST 1-continued

| Case | Component | Fault | Description of Function | Main Contact Circuit interrupted by | Red Lamp |
|------|-----------|-------|------------------------|-------------------------------------|----------|
| 16 | | no (simulated) damping possible | as case 13 | as case 13 | as case 13 |
| 17 | | damped or corres. fault | as case 14 | as case 14 | as case 14 |

LIST 2

Fault List for the individual Relay Contacts

| Case | Defect at Contact | Effect (Description of Function) | Main Contact Circuit interrupted by | Red Signal |
|------|-------------------|----------------------------------|-------------------------------------|------------|
| 18 | 1a | Relay 2 cannot attract, as case 6 | 3d, 4d, 5b opened | yes via 5e and 1d |
| 19 | 1b | Relay 3 cannot attract, as case 8 | 3d, 4d opened | no as 5e open since 5 not self-holding |
| 20 | 1c | Relay 5 cannot attract, as case 12 | 4d opened | no as 5 not attracted, as result 5e open |
| 21 | 1d | Normal operation, all other defaults detected | no interruption if no other faults | with fault: no as current path for red signal interrupted |
| 22 | 1e | No simulated damping possible, as cases 13 and 16 | 3d, 4d, 5b opened | yes via 5e and 1d |
| 23 | 2a | Relay 2 drops out too early, time not sufficient to cause relay 4 to attract and self-hold | 4d opened | no, 5 drops out again, as a result 5e open |
| 24 | 2b | Relay 3 cannot attract, as case 8 and case 19 | 3d, 4d opened | no as 5e open since 5 not self-holding |
| 25 | 2c | Relay 4 cannot attract, as case 10 | 4d opened | yes via 5e and 1d as 5 attracts via 1c and 2e and is self-holding via 5c, 4e, 2f |
| 26 | 2d | Normal operations but main contact circuit interrupted | fault at 2d | no if no other fault |
| 27 | 2e | Relay 5 drops out too early so that relay 4 does not attract | 4d opened | no if no other fault; yes if no simulated damping possible for one proximity switch |
| 28 | 2f | Normal operations if no other fault. If no (simulated) damping possible relay 2 cannot attract, 5 also not | 3d, 4d opened | no if no simulated damping possible. Yes if at least one proximity switch continuously damped (simulation) |
| 29 | 3a | Relay 2 cannot attract, as cases 6 and 18 | 3d, 4d, 5b opened | yes via 5e and 1d |
| 30 | 3b | Relay 3 not self-holding and drops out again when 4 is attracted. 4 then drops out again, 1 attracts again etc., circuit chatters when ON is depressed | 3d, 5d, 5b opened | yes via 5e and 1d |
| 31 | 3c | Relay 4 cannot attract, as cases 10 and 25 | 4d opened | yes via 5e and 1d (5 attracts via 1c, 2e and is self-holding if 2 drops out via 5c, 4e 2f) |
| 32 | 3d | Normal operations but main contact circuit interrupted | fault at 3d | no if no other fault |
| 33 | 4a | No starting possible | 3d, 4d opened | no, 5e remains open |
| 34 | 4b | Relay 3 cannot attract, as cases 8, 19 and 24 | 3d, 4d opened | no, 5e open (no self-holding of Relay 5) |
| 35 | 4c | Relay 4 not self-holding, drops out when relay 2 drops out | 4d, 5b opened | yes via 5e and 1d |
| 36 | 4d | Normal operations but main contact circuit interrupted | fault at 4d | no if no other fault |
| 37 | 4e | Normal operations if no other fault. No red signal if relay 3 has not dropped out | — | no if no other fault |
| 38 | 4f | Normal operations if no other fault. No red signal if after switching on, i.e. while machine is running, one of the proximity switches is damped or a fault appears. Also no locking in position of switching off means | 6b or 7b opened if damping of or defect in switch in addition | no if no further fault; also no if damping of or fault in switch in addition |
| 39 | 5a | Relay 4 cannot attract, as cases 10, 25 and 31 | 4d opened | yes via 5e and 1d (5 attracts via 1c, 2e and is self-holding if 2 drops out via 5c, 4e 2f) |
| 40 | 5b | Normal operations if no other fault but main contact circuit interrupted | fault at 5b | no if no other fault |
| 41 | 5c | Normal operations if no other fault. If at least one proximity switch cannot be damped and relay 2 does not attract relay 5 drops out after release of ON | — | no if no other fault; also no if 6(7) not dampable (simulation) as relay 5 not self-holding |
| 42 | 5e | Normal operations if no other fault. No red signal possible if faults occur | — | no as interruption at 5e |
| 43 | 6a or 7a | As cases 6, 18, 29 | 3d, 4d, 5b opened | yes via 5e and 1d |
| 44 | 6b or 7b | As cases 26, 32, 36 | fault at 6b or 7b | no if no other fault |
| 45 | 6c or 7c | Normal operations if no other fault. No red signal possible if after switching on (while the machine is running) at least one proximity switch is damped or a fault appears | (6b or 7b opened) | no as 5e open (5 receives no voltage) |

We claim:

1. Proximity switch for the monitoring of movable elements comprising an oscillator having an oscillatory circuit with an inductive control element variable in its impedance due to approaching elements and an electric monitoring means for monitoring the correct functioning of the proximity switch, characterized in that the monitoring means has an electrically switchable damping circuit (V, K; T5, R10-R12, K1; T6, R13, Rx, K2) for testing purposes, the oscillator (L, C1, R1, R2, T1, T2) being dampable with the aid of said damping circuit.

2. Proximity switch according to claim 1 comprising an inductive feeler head with a feeler coil in the oscillatory circuit of the oscillator, characterized in the provision of means for at least partially short-circuiting of the feeler coil (L) when the damping circuit (V, K; T5, R10-R12, K1) is switched in.

3. Proximity switch according to claim 2 comprising a feeler coil with tab, characterized in the provision of means for a short-circuiting of a coil portion (L1) of the feeler coil (L), said coil portion being disposed between the tab and one of the coil ends.

4. Proximity switch according to claim 2 or 3, characterized in that said short-circuiting means comprises a testing switch (K) connected in parallel with at least a portion of said feeler coil.

5. Proximity switch according to claim 4, characterized in that a predetermined series resistor (R12) is inserted in the short-circuiting means.

6. Proximity switch according to claim 3 characterized in that said short-circuiting means comprises a testing transistor having a collector-emitter circuit in parallel with said coil and a base and means including a testing switch for switching the potential of said base.

7. Proximity switch as in claim 6 characterized in the provision of a power source having a pair of terminals, means connecting said collector to the tab of said feeler coil, means connecting said emitter to one end of said feeler coil, means connecting said one end to one terminal of said source, a testing switch (K1) and a current limiting resistor (R11) for connecting the transistor base to the other terminal of the power source and a shunt (R10) connected between the transistor base and emitter.

8. Proximity switch according to claim 7, characterized in the provision of a filtering element (C3) connected in the base-emitter circuit of the testing transistor (T5).

9. Proximity switch according to claim 6, characterized in that a predetermined resistor (R12) is inserted between the tab of the feeler coil (L) and the collector of the testing transistor (T5).

10. Proximity switch according to claim 1 adapted to be activated at a predetermined distance of said approaching elements comprising a resistor connected in parallel with at least a portion of said control element determining said distance, characterized in that the damping circuit is designed such that the effective resistivity of the resistor (Rx, Rx') determining said distance is reducible when the damping circuit (T6, R13, Rx', K2) is switched in.

11. Prosimity switch according to claim 10, characterized in that said damping circuit comprises a testing switch (K2) and in that said resistor determining said distance is subdivided into two resistors (Rx, Rx'), a short-circuiting of one of these (Rx') being initiated by actuation of the testing switch (K2).

12. Proximity switch according to claim 11, characterized in that the collector-emitter circuit of a switching transistor (T6) is connected in parallel to the resistor (Rx'), which is capable of being short circuited, the base potential of said switching transistor being controllable by actuation of the testing switch (K2).

13. Proximity switch according to claim 1 characterized in that the monitoring means is connected with switching means (On, Off, Relay 1 to Relay 7) of a starting control circuit, said monitoring means being connected with said switching means such that each starting procedure necessarily initiates an electrical switching of the damping circuit (T5, R10-R12, C3) to dampen the oscillator (C, C1, R1, R2, T1, T2).

14. Proximity switch according to claim 13, characterized in that the switching means of the starting control circuit (FIG. 2) is a self-controlling switching means comprising means for testing the dampability of the oscillator.

15. Proximity switch according to claim 13, characterized in that said proximity switch is connected in parallel to a further proximity switch and that the switching means of the starting control circuit (FIG. 2) is a self-controlling switching means comprising means for testing the dampability of the oscillators of the proximity switches.

* * * * *